United States Patent [19]

Agarwala

[11] Patent Number: 4,965,518

[45] Date of Patent: Oct. 23, 1990

[54] MODIFIED VISCOMETER FOR EMPLOYMENT IN TORQUE MAGNETOMETRY

[75] Inventor: Ashok K. Agarwala, Penfield, N.Y.

[73] Assignee: Eastman Kodak Company, Rochester, N.Y.

[21] Appl. No.: 346,857

[22] Filed: May 3, 1989

[51] Int. Cl.$^5$ .................. G01R 33/00; G01N 27/72
[52] U.S. Cl. .................................... 324/228; 324/226; 324/262
[58] Field of Search ............... 324/209, 228, 226, 262, 324/258; 73/59

[56] References Cited

U.S. PATENT DOCUMENTS 2,574,795 11/1951 Miller .................................. 324/228

Primary Examiner—Reinhard J. Eisenzopf
Assistant Examiner—Walter E. Snow
Attorney, Agent, or Firm—Stephen C. Kaufman

[57] ABSTRACT

A method employing torque magnetometry for measuring magnetic properties of a workpiece, for example, measuring the anisotropy of a magnetic thin film. The present method utilizes a novel alternative to known methods of torque magnetometry, namely, employing a viscometer, as modified in accordance with the present invention. The present method preserves all the virtues of torque magnetometry, yet realizes method objectives of efficiency, low cost, and accurate measurement.

5 Claims, 3 Drawing Sheets

MODIFIED VISCOMETER FOR EMPLOYMENT IN TORQUE MAGNETOMETRY

FIELD OF THE INVENTION

This invention relates to a method suitable for measuring the magnetic properties of a workpiece.

INTRODUCTION TO THE INVENTION

Methods suitable for measuring the magnetic properties of a workpiece are preferably simple to employ, efficient, inexpensive, and provide a desired measurement accuracy. One important magnetic property of the workpiece that we are especially interested in applying a preferred method, is that of measuring the magnetic anisotropy (Ku) of the workpiece, for example, the magnetic anisotropy of magnetic thin films.

There exist several methods for measuring the magnetic anisotropy of magnetic thin films. The most direct and dependable known methods are based on torque magnetometry. Torque magnetometry comprises a method of measuring the torque exerted on the magnetic thin film by an applied magnetic field, as it slowly rotates around the thin film, while maintaining a quasi-static equilibrium. The measured torque parameter, in turn, may be used to determine the required magnetic anisotropy (Ku) of the thin film.

Torque magnetometry, in turn, requires a torque magnetometer. Much attention has been given to the design of the torque magnetometer. See, for example, R. F. Penoyer, Rev. Sci. Instrum. 30, 711 (1959); A. A. Aldenkamp, C. P. Marks, and H. Zijlstra, Rev. Sci. Instrum. 31, 544 (1960; F. B. Humphrey and A. R. Johnston, Rev. Sci. Instrum. 34, 348 (1963); D. M. Paige and B. K. Tanner, J. Phys. E 15, 128 (1982); M. Tejedor, A. Fernandez, B. Hernando, and J. Carrizo, Rev. Sci. Instrum. 56, 2160 (1985).

SUMMARY OF THE INVENTION

We have found that the various designs of torque magnetometers may typically require a sensitive and delicate setup consisting of fine torsion fibers or linear springs, and a mechanism to measure the torque by either measuring the angular displacement or by applying a known counter torque to achieve zero net displacement, i.e., a null-type torque magnetometer. We have found, moreover, that these torque magnetometers, requiring as they do such a sensitive and delicate setup, may work against the cost and efficiency objectives of a preferred method, noted above, for employing torque magnetometry to measure the anisotropy of the thin film.

The present invention, in contrast, provides a novel alternative to the employment of the known torque magnetometers—an alternative that can preserve all the virtues of torque magnetometry, yet realize the preferred method objectives of efficiency, low cost and accurate measurement.

The present invention, accordingly, comprises a method for measuring magnetic properties of a workpiece, comprising:

(1) providing an assembly, the assembly comprising
  (a) a viscometer, the viscometer comprising
    (i) an external spindle, and
    (ii) means for attaching the workpiece to the spindle; and
  (b) a magnet which can develop a magnetic field enveloping the workpiece;

(2) positioning the workpiece so that it is attached to the spindle and enveloped by the magnetic field;

(3) actuating the viscometer, thereby imparting movement to the workpiece; and (4) measuring a resultant torque thereby imparted to the workpiece.

The present invention, as defined, has an advantage that it may be employed for measuring the magnetization (M) of the workpiece, or for measuring particle orientation in various coated particle media, as well as for measuring the workpiece anisotropy (Ku). Further, the workpiece may be any material that has some appreciable magnetic capability, whether in the form of magnetic thin films, tapes, e.g., floppy disks, high temperature superconductor materials, or magneto-optic media, such as Co—Cr, Co—Ni, rare-earth-transition metals, etc.

BRIEF DESCRIPTION OF THE DRAWINGS

The invention is illustrated in the accompanying drawing, in which.

DETAILED DESCRIPTION OF THE INVENTION

Figure 1:
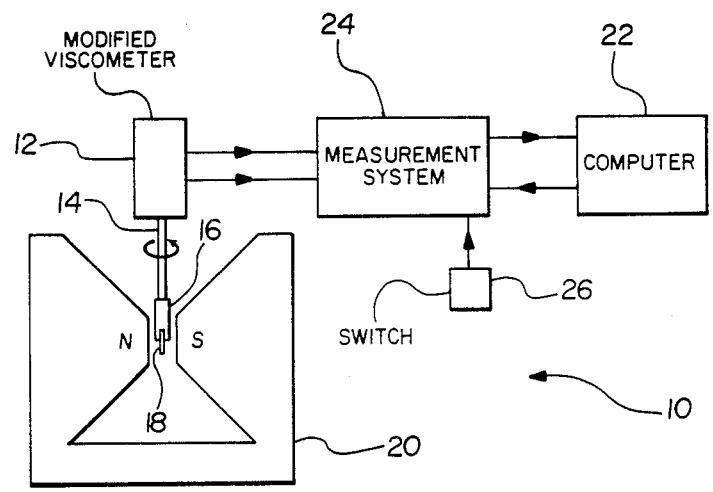
FIG. 1 is a schematic diagram of an assembly of the invention.
Figure 2:
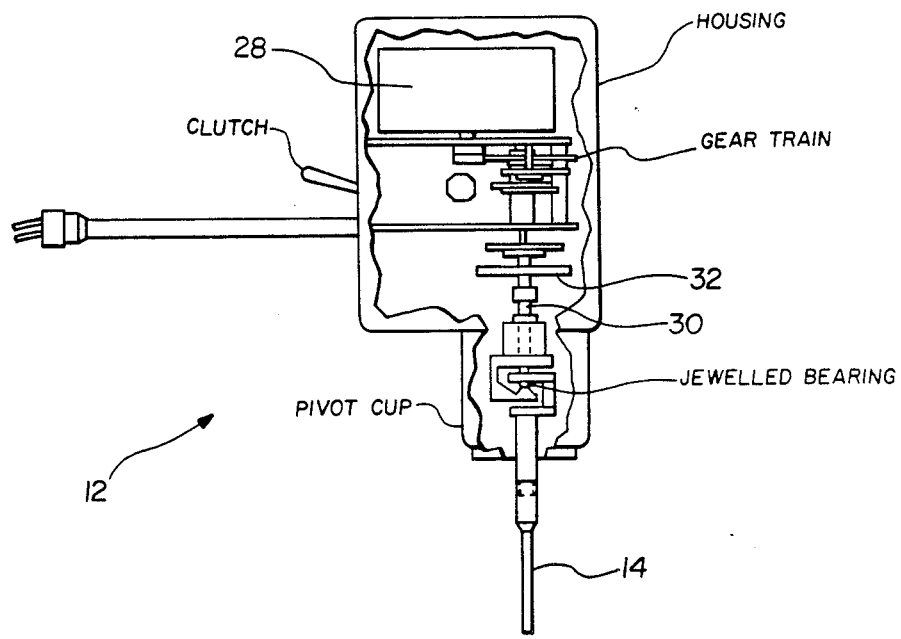
FIG. 2 shows details of a viscometer used in the FIG. 1 assembly.
Figure 3:
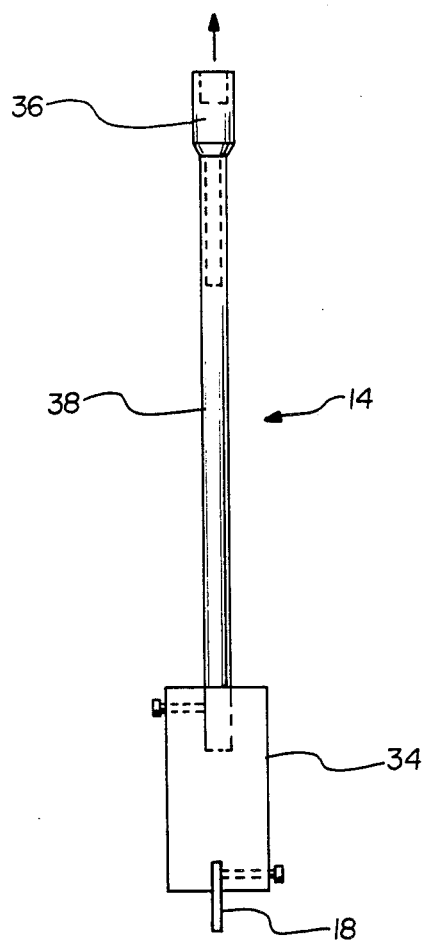
FIG. 3 is a diagram of further features of the FIG. 2 viscometer, as modified in accordance with the present invention.

Attention is now directed to the FIGS. 1-3, which show an assembly 10 (and details) of the present invention. The structure of the assembly 10 is first disclosed, followed by its operation, i.e., the method of the invention.

The FIG. 1 assembly 10 comprises a rotational viscometer 12, the viscometer 12, in turn, comprising an external spindle 14, and means 16 for attaching a magnetic workpiece 18 to the spindle 14. The workpiece 18 may be positioned so that it is enveloped by a magnetic field generated by an electromagnet 20. The assembly 10 further comprises a Hewlett Packard 310 series computer 22, a Hewlett Packard model 7090 measurement plotting system 24, and an external trigger switch 26.

Details of the rotational viscometer 12 are provided in FIG. 2. The viscometer 12 preferably is a Brookfield Instruments model LVTD viscometer, having a torque resolution of better than 0.6 dyne cm. The viscometer 12 is of the rotational type, as stated, and may be conventionally employed to measure the torque required to rotate the spindle 14 immersed in a given fluid. For our method, in sharp contrast, the viscometer 12 measures the torque experienced by the workpiece 18, attached to the spindle 14, and rotating in the externally applied magnetic field generated by the electromagnet 20.

The spindle 14 may be driven by a synchronous motor 28, which can be set to rotate at various speeds ranging from 0.3 rpm to 60 rpm. To achieve the quasi-equilibrium conditions required in the torque magnetometric measurements, however, a lower motor speed such as 0.3 rpm or 0.6 rpm, is preferred. A shaft 30 of the motor 28 may be connected to the spindle 14 through a calibrated beryllium-copper spring 32. The deflection of the spring 32, proportional to the amount of torque, may be detected by a rotary variable displacement transducer (RVDT). The transducer, in turn, provides an analog output signal, typically in the range of 0-10 mV or 0-1 V full scale. Knowing the spring 32 calibration constant (set forth below in an Appendix), the output voltage signal can be readily converted into dyne cm for torque. Other major mechanical components of the viscometer 12, for example, the housing, gear train, pivot cup, jewelled bearing and clutch, are so labelled in FIG. 2.

Further details on the viscometer 12 are provided in FIG. 3. In particular, FIG. 3 shows the spindle 14, and the means for attaching the magnetic workpiece 18 to the spindle 14, where the means is identified in FIG. 3 as a workpiece-holder 34. The spindle 14 and the workpiece-holder 34, taken together, are constructed in accordance with a novel design, discovered by us, for the purposes of modifying a conventional viscometer, to the end of the present invention. Accordingly, we may reference this modified viscometer by the generic expression, "torquemeter".

A portion of the modified viscometer 12 is shown in FIG. 3, and comprises a three-part assembly viz., a stainless steel spindle 36, a ceramic extension tube 38, and the thin film workpiece-holder 34 made of Plexiglas. The stainless steel spindle 36 is a cylindrical rod, preferably about 7.6 cm in length and 3.18 mm in diameter. At one end of the spindle 36, there is a cup with its outer diameter preferably about twice the diameter of the rod. This cup may be threaded from the inside, allowing the spindle 36 to screw directly onto the rotating assembly of the viscometer 12.

A straight ceramic tube 38 (4.75 mm o.d., 3.18 mm i.d., and having a camber of less than 1.5 mm over its 30.5 cm length) may be used as an extension between the stainless steel spindle 36 and the workpiece-holder 34. This extension tube 38 allows the workpiece 18 to reach the magnetic field generated by the electromagnet 20. The long and slender part of the stainless steel spindle 36 up to the neck of the cup may be snugly inserted in the ceramic tube 38 and glued with epoxy, keeping the alignment of the assembly straight. A preferred ceramic tube used for the extension part is made by McDanel Refractory Porcelain Co., PA, using material called Mulite (MV-20) consisting of magnetic or metallic impurities at the minimum level. Note that it is important that no metallic material be used for the parts of this assembly that are close to the magnetic field. Otherwise, large errors due to the eddy currents generated during the rotation of the assembly may result.

The workpiece-holder 34 preferably is made of Plexiglas. It may be made out of a rod 12.7 mm and 10.2 cm long. A 3.8 cm deep hole may be drilled at the center from the top to allow the ceramic extension tube 38 to insert snugly into it. A nylon screw can hold it in place. At the other end of the workpiece-holder rod, a diametrical slit about 0.76 mm wide and 7.6 mm deep may be cut vertically into the rod. The workpiece 18 may be placed in this slit, and may be held in place by another nylon screw coming from the side. Workpieces with flexible substrates can be sandwiched between a pair of thin microscope cover glasses, before attaching to the workpiece holder 34.

As identified above in FIG. 1, the assembly 10 comprises an electromagnet 20. The electromagnet 20 preferably comprises a Varian CFT-20 electromagnet with water-cooled coils. This electromagnet has 17.8 cm diam poles tapered down to a 10.2 cm diameter. When mounted, this forms a gap of 2.0 cm between the poles. In this configuration, the electromagnet 20 provides a dc field of about 16 kOe in the gap.

The structure of the assembly 10 of the present invention has now been disclosed, and we turn to its operation, i.e., the method of the invention. In accordance with one aspect of the method summarized above, a workpiece 18 comprising a $C_o$—$N_i$ thin film is attached to the workpiece-holder 34. The workpiece 18 is then rotated in the magnetic field developed by the electromagnet 20.

The resulting output from the RVDT of the viscometer 12 is stored into a buffer memory of the HP 7090 measurement plotting system, along with the corresponding time for each data point. On activating the trigger switch 26, the data storage begins. This switch may be manually triggered when, during the rotation of the workpiece 18, the film plane lies normal to the applied field (i.e., at 0°), as determined by a careful visual inspection. For accuracy, one can employ a photo-switch, an LED, and a mirror arrangement for automatic triggering. At the end of one revolution, all the data are transferred to the HP 310 computer. From each pair of data consisting of the value of RVDT output in volts and the corresponding time in seconds, the torque in dyne cm and the position of the workpiece with respect to the applied fields in degrees, may be calculated. This is done through a program written in BASIC which incorporates the calibration constant and the rotational speed of the workpiece. The calibration procedure is described in the Appendix below, and an exemplary BASIC program is also listed below.

THEORETICAL DESCRIPTION OF THE METHOD

The magnitude of the intrinsic anisotropy $K_u$ of a magnetic thin film and its direction at an angle $\delta$ with respect to the film normal can be obtained from the torque curves using Eqs. (1) and (2), respectively:

$$K_u = (k_s^2 + T_p^2 \pm 2 K_s T_p \cos 2\alpha_0) \quad (1)$$

$$\delta = \alpha_0 - \tfrac{1}{2} \arctan [(K_s \sin 2\alpha_0)/(K_s \cos 2\alpha_0 \pm T_p)]. \quad (2)$$

Here, the positive sign is taken when $\pi/4 \leq \alpha_0 \leq \pi/2$ and the negative sign is taken when $0 \leq \alpha_0 \leq \pi/4$.

For this, one needs to know the peak torque $T_p$ and the zero-torque position $\alpha_0$ (i.e., the angle between the normal of the film and the applied field at which torque is zero) from the torque curves and the total shape anisotropy $K_s$ of the film. However, knowing the saturation magnetization $M_s$ and the volume V of the film, its $K_s$ is given by $2\pi M_s^2 V$.

Since this torque magnetometer is not a null-type, a correction for the angular position of the workpiece 18 with respect to the applied field direction, may be required. This correction is dependent upon the amount of torque, and is related through the spring constant k of the torquemeter, as shown in Eq. (3):

$$\alpha_{corrected} = \alpha_{observed} - [T - T_0)/k]. \quad (3)$$

Here, at a given time t, $\alpha_{observed} = \omega t$, $\omega$ being the rotational speed of the workpiece, and $T_0$ is the torque at $t=0$. Knowing k, $\alpha_{corrected}$ at all times can be easily calculated from Eq. (3). We compute this correction through a subroutine included in the BASIC program referred to earlier. The spring constant k can be experimentally determined as discussed in the Appendix.

Figure 4:
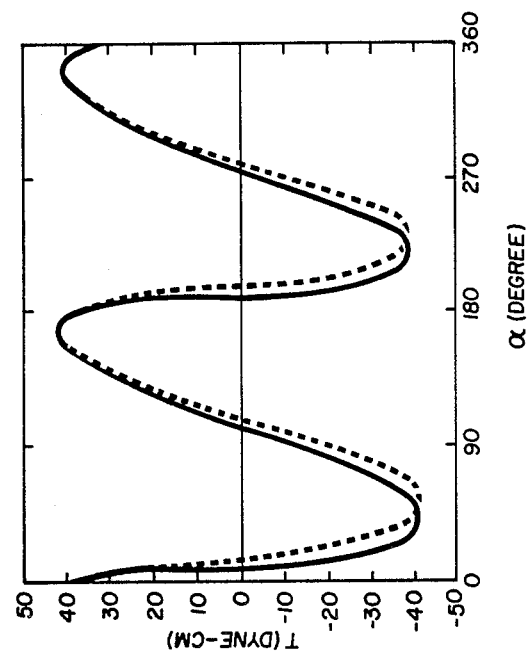
FIG. 4 is a torque curve generated in accordance with the present invention.

In FIG. 4, we show the torque curves of a Co-Ni thin-film workpiece approximately 90-nm thick deposited at an oblique angle on a Kapton substrate by thermal evaporation. The workpiece used for torque measurements is in the form of a 16.5-mm-diam disk. The solid curve in the Figure represents torque vs $\alpha_{observed}$ curve, as obtained from the torque magnetometer, and the dashed curve is a plot of torque vs $\alpha_{corrected}$.

When the direction of the intrinsic anisotropy in the film is known a priori, or in special cases where the anisotropy is either in-plane or perpendicular to the film, the value of $T_p$ alone from the torque curve curves is sufficient in determining $K_u$ of the film. In such cases, one does not need to correct for $\alpha$.

APPENDIX
CALIBRATION AND SPRING-CONSTANT DETERMINATION

A small piece of a uniform wire made of pure nickel or iron of known radius r and length 1, may be used as a calibration standard. It is sandwiched between two thin glass slides, and mounted in the workpiece-holder 34 of the torquemeter, such that the length of the wire always lies in the plane of rotation. The total anisotropy $K_{cal}$ of this calibration workpiece is simply its shape anisotropy given by $$K_{cal} = \pi^2 r^2 M_s^2 1, \quad (4)$$

where $M_s$ now refers to the saturation magnetization of either pure nickel (485 emu/cc) or pure iron (1671 emu/cc), whichever is the case. This calculated value of $K_{cal}$ is equivalent to the zero-to-peak value in volts of the output tracing from the torquemeter. A calibration standard made of pure nickel wire 0.10 mm in diameter and 10.0 mm in length produces a peak value of about 35.5 mV in the output. Using Eq. (4), the anisotropy $K_{cal}$ of this calibration sample may be calculated to be about 58.4 dyne cm. From this, we obtain a calibration constant of 0.608 dyne cm/mV.

The spring constant k of the torquemeter is determined by torsioning the spring of the torquemeter by a known amount (in degrees) and noting the corresponding output from the torquemeter (in mV). A protractor placed directly underneath the workpiece-holder 34 of the torquemeter, and a pointer temporarily attached to the workpiece-holder 34, indicates the torsion angle. With the motor 28 switched off, the spindle 14 of the torquemeter is allowed to reach equilibrium indicated by zero volt output. The protractor is now aligned with the pointer to indicate 0°. The pointer is then manually moved to some new position, say 5°, and is held at that position for a few seconds. The output of the torquemeter connected to an X-Y recorder indicates a jump in the voltage, corresponding to this torsion of 5°.

Figure 5:
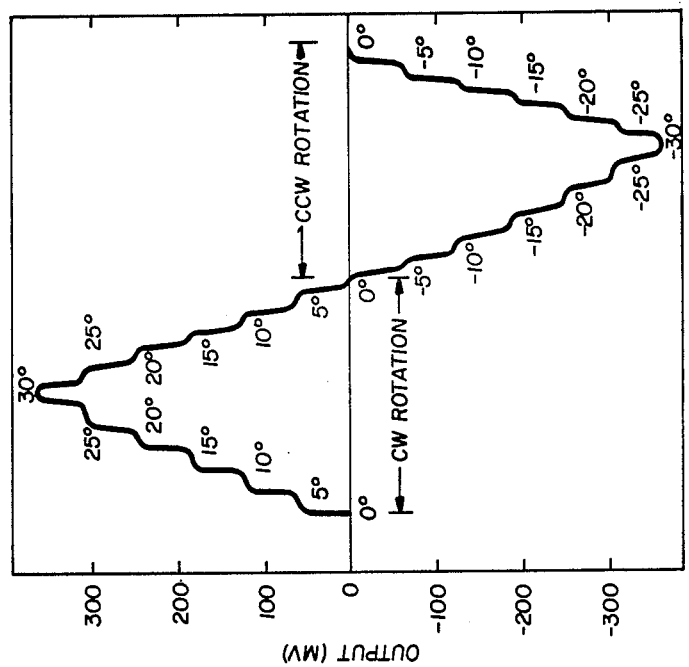
FIG. 5 is a plot of output voltage at different torsion angles, for determining the spring constant of the FIG. 2 viscometer.

In FIG. 5, we show a plot of output voltages corresponding to torsion angles ranging from $+30°$ to $-30°$, in steps of 5°. From this plot, we obtain a spring constant of about 12.4 mV/deg or 7.54 dyne cm/deg using the calibration constant mentioned above. It is also noticed in this experiment that the torquemeter output is approximately linear up to $+90°$ torsion angle for a clockwise (cw) rotation, and up to $-40°$ for a counterclockwise (ccw) rotation. This corresponds to a torque limit of approximately 680 dyne cm for cw rotation, and 300 dyne cm for ccw rotation.

PROGRAM

The following Program, written in Basic and in accordance with the precepts disclosed above, is now listed. The workpiece 18 comprises a magnetic thin film comprising a Co-Ni composition.

```
list
10 CLS
20 REM this FINAL version of "dig.bas" will scale and rotate given the two
30 REM scaling pts. and the corresponding bit pad coordinates
40 REM
50 REM this program accepts as input the file "GRAPH1.PD1" created by
60 REM ProDesign.  This program will move the curve to the correct origin
70 REM while putting a correct scale on it.
80 REM
90 PRINT "This program will accept GRAPH.PD1 as input, relocate it "
100 PRINT "at the proper origin relative to the graph paper, and scale it"
110 REM
120 FOR PAUSE = 1 TO 2500
130    NEXT PAUSE
140 CLS
150 REM ***********************************************************
160 REM MAIN program that calls subroutines to do the work
170 REM
180 REM
190 REM CALL  to move points to the correct origin as well as read scaling pts.
200 GOSUB 340
210 REM
220 REM CALL to find  angle of rotation
230 GOSUB 760
```

```
240 REM the next routine rotates all the points on the curve
250 GOSUB 960
260 REM now find the correct scaling numbers
270 GOSUB 1170
280 REM
290 REM do the scaling of the points
300 GOSUB 1270
310 REM
320 PRINT "Points rotated and scaled"
323 REM call routine to find corrected theta
325 GOSUB 1700
330 END
340 REM **************************************************
350 REM this routine moves the curve to the origin and reads in scaling pts.
360 REM
370 REM
380 OPEN "graph1.pd1" FOR INPUT AS #1
390 OPEN "origin.dat" FOR OUTPUT AS #2
400 REM
410 REM READ IN PRODESIGN PARAMETERS AS DUMMIES
420 FOR NOGOOD = 1 TO 10
430     INPUT #1, DUMMY
440   NEXT NOGOOD
450 REM now read in the scaling pts (also used to rotate)
460 INPUT #1, XORIGIN
470 INPUT #1, YORIGIN
480 INPUT #1, XREF
490 INPUT #1, YREF
500 REM also get the graph paper equivalents
510 PRINT ""
520 PRINT "Enter the origin and scaling reference points from graph paper"
530 PRINT""
540 PRINT "Enter origin points (always 0,0) ......."
550 INPUT "X coordinate  ", XORIGINDATA
560 INPUT "Y coordinate  ", YORIGINDATA
570 PRINT ""
580 PRINT "Enter the reference point coordinates"
590 PRINT ""
600 INPUT "X reference point  ", XREFDATA
610 INPUT "Y reference point  ", YREFDATA
620 REM now move the data to origin
630 REM
640 WHILE NOT EOF(1)
650     INPUT #1, XCOORD
660     INPUT #1, YCOORD
670       XMOVED = XCOORD - XORIGIN
680       YMOVED = YCOORD - YORIGIN
690             PRINT XMOVED, YMOVED
700             PRINT #2, XMOVED, YMOVED
710 WEND
720 REM now all the pts. are at origin
730 CLOSE
740 RETURN
750 REM **************************************************
760 REM this routine simply calculates the angle of rotation given
770 REM the reference and origin coordinates
780 REM
790 REM the angle of rotation can be found by trig
800 REM
810 REM    tan(alpha + theta) = tan(alpha)+-tan(theta)/
820 REM                           1+-tan(alpha)tan(theta)
830 REM
840 REM
850 THETA = ATN((YREFDATA - YORIGINDATA)/(XREFDATA-XORIGINDATA))
860 PRINT ""
870 REM find alpha + theta then subtract theta to get alpha
880 REM alpha = the angle of rotation
890 OMEGA = ATN((YREF-YORIGIN)/(XREF-XORIGIN))
900 PRINT ""
910 ALPHA = OMEGA - THETA
920 PRINT "So, the angle of rotation, alpha = ",ALPHA
930 REM angle of rotation found
940 RETURN
```

```
950 REM ***********************************************************
960 REM here the points are rotated
970 PRINT "Points being rotated......"
980 OPEN "origin.dat" FOR INPUT AS #1
990 OPEN "rotated.dat" FOR OUTPUT AS #2
1000 REM
1010 REM using the formulas:
1020 REM                     Xr = x'cos(alpha) + y'sin(alpha)
1030 REM                    -[Yr = x'sin(alpha) - y'cos(alpha)]
1040 REM
1050 WHILE NOT EOF(1)
1060      INPUT #1, XCOORD
1070      INPUT #1, YCOORD
1080         XROTATED = XCOORD*COS(ALPHA) + YCOORD*SIN(ALPHA)
1090         YROTATED = XCOORD*SIN(ALPHA) - YCOORD*COS(ALPHA)
1100         YROTATED = -YROTATED
1110      PRINT XROTATED, YROTATED
1120      PRINT #2, XROTATED, YROTATED
1130 WEND
1140 CLOSE
1150 RETURN
1160 REM ***********************************************************
1170 REM the scaling factors will be found here, must rotate first
1180    XREFR = XREF*COS(ALPHA) + YREF*SIN(ALPHA)
1190    YREFR = -(XREF*SIN(ALPHA) - YREF*COS(ALPHA))
1200    XORIGINR = XORIGIN*COS(ALPHA) + YORIGIN*SIN(ALPHA)
1210    YORIGINR = -(XORIGIN*SIN(ALPHA) - YORIGIN*COS(ALPHA))
1220 XSCALE = (XREFR - XORIGINR)/(XREFDATA  - XORIGINDATA )
1230 YSCALE = (YREFR - YORIGINR)/(YREFDATA  - YORIGINDATA )
1240 REM
1250 PRINT ""
1260 RETURN
1270 REM ***********************************************************
1280 REM scaling done here
1290 REM
1300 OPEN "rotated.dat" FOR INPUT AS #1
1310 OPEN "scaled.dat" FOR OUTPUT AS #2
1320 PRINT "Enter the calibration for X and Y   (default = 1)"
1330 INPUT "X calibration --->", XCALIBRATION
1340 INPUT "Y calibration --->", YCALIBRATION
1350    IF XCALIBRATION <>  0 GOTO 1360 ELSE XCALIBRATION = 1
1360    IF YCALIBRATION <>  0 GOTO 1370 ELSE YCALIBRATION = 1
1370 REM
1380 REM
1390 WHILE NOT EOF(1)
1400     INPUT #1, XCOORD
1410     INPUT #1, YCOORD
1420       XSCALED = (XCOORD/XSCALE)*XCALIBRATION
1430       YSCALED = (YCOORD/YSCALE)*YCALIBRATION
1440         PRINT XSCALED, YSCALED
1450         PRINT #2, XSCALED,YSCALED
1460 WEND
1470 CLOSE
1480 RETURN
1490 REM ***********************************************************
1700 REM this routine takes the spring effect into account when calculating
1710 REM torque for a given angle of theta.
1720 REM theta corrected = theta + (1/spg k)*(torque at zero - torque)
1730 REM
1740 INPUT "Enter the spring constant --->", SPRINGK
1750 PRINT ""
1760 INPUT "Enter the torque at theta equal to zero degrees --->",TORQUESUBZERO
1765 TORQUESUBZERO = TORQUESUBZERO * YCALIBRATION
1770 PRINT ""
1780 OPEN "scaled.dat" FOR INPUT AS #1
1790 OPEN "thetacor.dat" FOR OUTPUT AS #2
1800 REM
1810 CLS
1820 PRINT "Theta correction taking place....."
1830 PRINT ""
1840 PRINT #2, "Theta     Theta corrected    Torque"
1850 PRINT "Theta      Theta corrected    Torque"
1860 REM
1870 REM loop to read in and do theta correction
1880 WHILE NOT EOF(1)
```

```
1900        INPUT #1, THETA
1910        INPUT #1, TORQUE
1915 THETACOR = THETA + (1/SPRINGK)*(TORQUESUBZERO - TORQUE)
1920          PRINT #2, THETA, THETACOR, TORQUE
1930          PRINT THETA, THETACOR, TORQUE
1940 WEND
1950 CLOSE
1955 PRINT "Theta recalculated"
1960 REM ***********************************************************
Ok
```

A What is claimed is:

1. A method for measuring magnetic properties of a workpiece, comprising:
   (1) providing an assembly, the assembly comprising
      (a) a viscometer, the viscometer comprising
         (i) an external spindle, and
         (ii) means for attaching the workpiece to the spindle; and
      (b) a magnet which can develop a magnetic field enveloping the workpiece;
   (2) positioning the workpiece so that it is attached to the spindle and enveloped by the magnetic field;
   (3) actuating the viscometer, thereby imparting movement to the workpiece; and
   (4) measuring a resultant torque thereby imparted to the workpiece.

2. A method according to claim 1, wherein the magnet is an electromagnet.

3. A method according to claim 1, wherein the viscometer is actuated so that the sample rotates in the magnetic field.

4. A method according to claim 1, wherein the spindle comprises a non-magnetic extension tube for engaging the workpiece.

5. A method according to claim 1, wherein the spindle comprises a ceramic extension tube for engaging the workpiece.

* * * * *

UNITED STATES PATENT AND TRADEMARK OFFICE
CERTIFICATE OF CORRECTION

PATENT NO. : 4,965,518

DATED : October 23, 1990

INVENTOR(S) : Ashok K. Agarwala

It is certified that error appears in the above-identified patent and that said Letters Patent is hereby corrected as shown below:

Col. 4, line 49    Delete "cps" and substitute therefor --cos--.

Signed and Sealed this

Eighteenth Day of February, 1992

Attest:

HARRY F. MANBECK, JR.

Attesting Officer    Commissioner of Patents and Trademarks